United States Patent
Bowers et al.

(10) Patent No.: US 12,355,213 B2
(45) Date of Patent: Jul. 8, 2025

(54) QUANTUM DOT LASERS AND METHODS FOR MAKING THE SAME

(71) Applicant: The Regents of the University of California, Oakland, CA (US)

(72) Inventors: John E. Bowers, Santa Barbara, CA (US); Arthur Gossard, Santa Barbara, CA (US); Daehwan Jung, Goleta, CA (US); Kunal Mukherjee, Goleta, CA (US); Justin Norman, Goleta, CA (US); Jennifer Selvidge, Goleta, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 1016 days.

(21) Appl. No.: 17/058,012

(22) PCT Filed: May 24, 2019

(86) PCT No.: PCT/US2019/033980
§ 371 (c)(1),
(2) Date: Nov. 23, 2020

(87) PCT Pub. No.: WO2019/227026
PCT Pub. Date: Nov. 28, 2019

(65) Prior Publication Data
US 2021/0218230 A1    Jul. 15, 2021

Related U.S. Application Data

(60) Provisional application No. 62/676,109, filed on May 24, 2018.

(51) Int. Cl.
*H01S 5/34* (2006.01)
*H01S 5/343* (2006.01)

(52) U.S. Cl.
CPC .......... *H01S 5/3406* (2013.01); *H01S 5/3412* (2013.01); *H01S 5/34353* (2013.01); *H01S 5/3436* (2013.01)

(58) Field of Classification Search
CPC .. H01S 5/3406; H01S 5/3412; H01S 5/34353; H01S 5/3436; H01S 2301/173; H01S 5/3403; H01S 5/021; B82Y 20/00
See application file for complete search history.

(56) References Cited

U.S. PATENT DOCUMENTS 5,562,770 A * 10/1996 Chen .............. C30B 25/18
117/106
6,566,688 B1 * 5/2003 Zhang .............. H01S 5/3434
257/85

(Continued)

FOREIGN PATENT DOCUMENTS

JP     2005072338 A  *  3/2005  ............. B82Y 20/00
WO   WO-2017210300 A1 * 12/2017 ............. G02B 6/131
WO    2019/227026 A1    11/2019

OTHER PUBLICATIONS

International Search Report and Written Opinion mailed Aug. 19, 2019.

(Continued)

*Primary Examiner* — Xinning(Tom) Niu
(74) *Attorney, Agent, or Firm* — Billion & Armitage

(57) ABSTRACT

A quantum dot (QD) laser comprises a semiconductor substrate and an active region epitaxially deposited on the semi-conductor substrate. The active region includes a plurality of barrier layers and a plurality of QD layers interposed between each of the plurality of barrier layers. A net compressive strain associated with the plurality of QD layers is maintained below a maximum allowable strain to prevent formation of misfit dislocations within the active region of the QD laser.

11 Claims, 6 Drawing Sheets

(56) References Cited

U.S. PATENT DOCUMENTS

| | | | |
|---|---|---|---|
| 2004/0043523 A1* | 3/2004 | Bour | H01L 21/02543 438/20 |
| 2004/0135136 A1* | 7/2004 | Takahashi | H01L 33/32 257/14 |
| 2005/0157765 A1* | 7/2005 | Johnson | H01S 5/18311 372/39 |
| 2010/0051900 A1* | 3/2010 | Huffaker | H01L 31/03046 257/14 |
| 2010/0301306 A1* | 12/2010 | Albo | H01L 31/112 977/891 |
| 2011/0140084 A1* | 6/2011 | Hatori | H01S 5/3412 257/17 |
| 2015/0244151 A1* | 8/2015 | Liu | H01S 5/3412 438/47 |

OTHER PUBLICATIONS

Andrekson, et al., "Novel Technique for Determining Internal Loss of Individual Semiconductor Lasers", Electronics Letters, vol. 28, No. 2, Jan. 16, 1992, pp. 171-172.
Casey, et al., "GaAs—AlxGa1—xAs Heterostructure Laser with Separate Optical and Carrier Confinement", Journal of Applied Physics, vol. 45, No. 1, Jan. 1974, pp. 322-333.
Cassidy, "Technique for Measurement of the Gain Spectra of Semiconductor Diode Lasers", Journal of Applied Physics, vol. 56, No. 11, Dec. 1, 1984, pp. 3096-3099.
Chen, et al., "Electrically Pumped Continuous-Wave 1.3 μM InAs/GaAs Quantum Dot Lasers Monolithically Grown on On-Axis Si (001) Substrates", Optics Express vol. 25, No. 5, 2017, pp. 4632-4639.
Chen, et al., "Electrically Pumped Continuous-Wave III-V Quantum Dot Lasers on Silicon", Nature Photonics, vol. 10, Mar. 7, 2016, pp. 307-311.
Chen, et al., "Long Lifetime Quantum-Dot Laser Monolithically Grown on Silicon", 2016 IEEE 13th International Conference on Group IV Photonics (Gfp), 2016, pp. 147-148.
Chu, et al., "Antiphase Domains in GaAs Grown by Metalorganic Chemical Vapor Deposition on Silicon-on-insulator", Journal of Applied Physics, vol. 64, No. 6, Sep. 15, 1988, pp. 2981-2989.
Eliseev, et al., "Ground-State Emission and Gain in Ultralow-Threshold InAs—InGaAs Quantum-Dot Lasers", IEEE Journal of Selected Topics in Quantum Electronics, vol. 7, No. 2, Mar./Apr. 2001, pp. 135-142.

Jung, et al., "High Efficiency Low Threshold Current 1.3 μM InAs Quantum Dot Lasers on On-Axis (001) GaP/Si", Applied Physics Letters, vol. 111, 2017, pp. 122107-1-122107-4.
KIMERLING "Recombination Enhanced Defect Reactions", Solid-State Electronics, vol. 21, 1978, pp. 1391-1401.
Liu, et al., "Electrically Pumped Continuous-Wave 1.3 μM Quantum-Dot Lasers Epitaxially Grown on On-Axis (001) GaP/Si", Optics Letters vol. 42, No. 2, Jan. 15, 2017, pp. 338-341.
Liu, et al., "High Performance Continuous Wave 1.3 μM Quantum Dot Lasers on Silicon", Applied Physics Letters, vol. 104, 041104, 2014, 4 pages.
Liu, et al., "Reliability of InAs/GaAs Quantum Dot Lasers Epitaxially Grown on Silicon", IEEE Journal of Selected Topics in Quantum Electronics, vol. 21, No. 6, Nov./Dec. 2015, 8 pages.
Nemeth, et al., "Heteroepitaxy of GaP on Si: Correlation of Morphology, Anti-Phase-Domain Structure and MOVPE Growth Conditions", Journal of Crystal Growth, vol. 310, 2008, pp. 1595-1601.
Norman, et al., "Electrically Pumped Continuous Wave Quantum Dot Lasers Epitaxially Grown on Patterned, On-Axis (001) Si", Optics Express vol. 25, No. 4, Feb. 20, 2017, pp. 3927-3934.
Sahli, et al., "High Efficiency and High Modal Gain InAs/InGaAs/GaAs Quantum Dot Lasers Emitting at 1300 Nm", Semiconductor Science and Technology, vol. 22, 2007, pp. 396-398.
Salhi, et al., "Enhanced Modal Gain of Multilayer in as/in Ga As/Ga As Quantum Dot Lasers Emitting at 1300 Nm", Journal of Applied Physics, vol. 100, 2006, pp. 123111-1-123111-4.
Salhi, et al., "Enhanced Performances of Quantum Dot Lasers Operating at 1.3 μm", IEEE Journal of Selected Topics in Quantum Electronics, vol. 14, No. 2, Jul./Aug. 2008, pp. 1188-1196.
Shchekin, et al., "1.3 μm InAs Quantum Dot Laser with To=161 K from 0 to 80 °C", Applied Physics Letters, vol. 80, No. 18, May 6, 2002, pp. 3277-3279.
Shtengel, et al., "Advances in Measurements of Physical Parameters of Semiconductor Lasers", International Journal of High Speed Electronics and Systems, vol. 9, No. 4, 1998, pp. 901-940.
Shtengel, et al., "Internal Optical Loss Measurements in 1.3 μM InGaAsP Lasers", Electronics Letters, vol. 31, No. 14, Jul. 6, 1995, pp. 1157-1159.
Srinivasan, et al., "Reliability of Hybrid Silicon Distributed Feedback Lasers", IEEE Journal of Selected Topics in Quantum Electronics, vol. 19, No. 4, Jul./Aug. 2013, 5 pages.
Thomson, et al., "Roadmap on Silicon Photonics", Journal of Optics, vol. 18, 073003, 2016, 20 pages.
Wan, et al., "1.3 μM Submilliamp Threshold Quantum Dot Micro-Lasers on Si", Optica, vol. 4, No. 8, Aug. 2017, pp. 940-944.

* cited by examiner

QUANTUM DOT LASERS AND METHODS FOR MAKING THE SAME

CROSS-REFERENCE TO RELATED APPLICATIONS

This application claims the benefit of U.S. Provisional Application No. 62/676,109 filed on May 24, 2018 and which application is incorporated herein by reference. A claim of priority is made.

STATEMENT OF GOVERNMENT LICENSE RIGHTS

This invention was made with Government support under Grant No. DE-AR0000672, awarded by the U.S. Department of Energy. The Government has certain rights in this invention.

TECHNICAL FIELD

This invention relates generally to quantum dot devices and in particular to quantum dot lasers.

BACKGROUND

III/V lasers epitaxially grown on silicon (Si) have been actively studied for their potential applications such as monolithic integration of large-scale Si electronics and various III/V photonic devices. From a materials standpoint, growth of III/V layers on Si faces two major challenges. The large lattice mismatch (~4%) and heterovalent polar/nonpolar interface between III/V and Si result in high threading dislocation density (TDD) and antiphase domains (APDs), respectively.

As a result of TDDs and APDs, the reliability and/or expected lifetime of III-V lasers epitaxially grown on Si is relatively short.

SUMMARY

According to some embodiments, a quantum dot (QD) laser comprises a semiconductor substrate and an active region epitaxially deposited on the semiconductor substrate. The active region includes a plurality of barrier layers and a plurality of QD layers interposed between each of the plurality of barrier layers, wherein a net compressive strain associated with the plurality of QD layers is maintained below a maximum allowable strain to prevent formation of misfit dislocations within the active region of the QD laser.

According to some embodiments, a quantum dot (QD) laser includes a semiconductor substrate and an active region deposited on the semiconductor substrate. The active region includes a plurality of barrier layers and a plurality of QD layers interposed between each of the plurality of barrier layers, wherein each barrier layer provides a strain that at least partially offsets a strain introduced by each QD layer.

According to some embodiments, a quantum dot (QD) laser includes a semiconductor substrate and an active region deposited on the semiconductor substrate. The active region includes a plurality of barrier layers and a plurality of QD layers interposed between each of the plurality of barrier layers, wherein the active region includes a plurality of threading dislocations extending from one or more misfit dislocations formed between the semiconductor substrate and the active region, wherein the threading dislocations do not terminate at misfit dislocations within the active region.

DETAILED DESCRIPTION

A quantum dot (QD) laser comprises a semiconductor substrate and an active region epitaxially deposited on the semiconductor substrate. The active region includes a plurality of barrier layers and a plurality of QD layers interposed between each of the plurality of barrier layers. A net compressive strain associated with the plurality of QD layers should be maintained below a maximum allowable strain to prevent formation of misfit dislocations within the active region of the QD laser.

Figure 1:
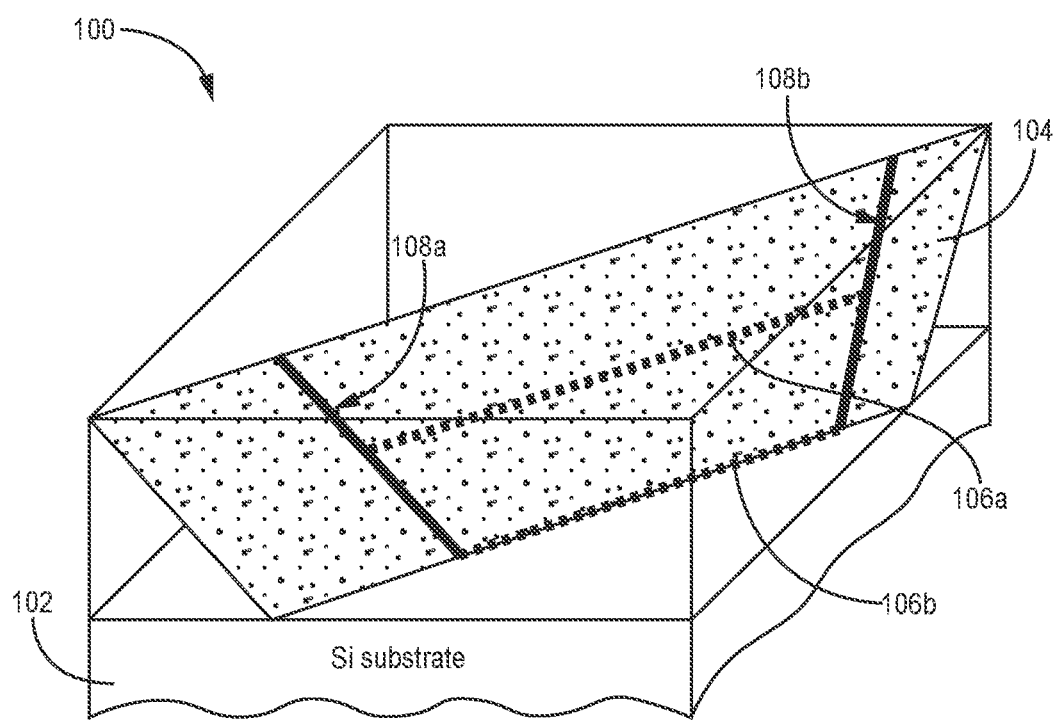
FIG. 1 is an orthographic view of a photonic integrated circuit in which a III-V active layer is epitaxially grown on a silicon (Si) substrate as known in the prior art.

FIG. 1 is an orthographic view of a photonic integrated circuit 100 in which a III V active layer is epitaxially grown on a silicon (Si) substrate as known in the prior art. In particular, PIC 100 includes a silicon (Si) substrate 102 and a III-V active layer 104 epitaxially deposited on a planar surface of Si substrate 102. Typically—although not always—a buffer layer (not shown) is formed between the Si substrate 102 and the active layer 104. The silicon substrate is defined by a lattice constant, as is the III-V active layer 104 and the buffer layer. Difference between the respective lattice constants results ire misfit dislocation 106a between Si substrate 102 and the buffer layer (e.g., Gallium Arsenide (GaAs) (or active layers 104). For each misfit dislocation 106a formed at the boundary between the Si substrate 102 and the buffer layer (or III-V active layer 104), one or more threading locations 108a and 108b are formed that extend away from the misfit dislocations 106a toward a surface. The threading dislocations serve as a heterogeneous source for new misfit dislocations, which may be formed within one of the III-V active layers 104. In addition to the misfit dislocation 106a formed at the boundary of the silicon substrate 102 and buffer layer, another misfit dislocation 106b is formed in the III-V active layer 104. Misfit dislocation 106b is formed, at least in part, as a result of the presence of the one or more threading dislocations 108a, 108b and the accumulating compressive strain energy resulting from differences in lattice constants between the III-V quantum dot material and the III-V barrier material. By stacking a plurality of layers of quantum dots the net strain is increased until a maximum allowable strain is reached wherein a misfit dislocation 106b is formed perpendicular to threading dislocations 108a and/or 108b to plastically relax the net strain. It should be noted that in embodiments in which the III-V active layer is epitaxially grown on a III-V substrate, no misfit dislocations are formed between the respective substrate and active layers, and therefore no threading dislocations are formed. Although stacking a plurality of layers of quantum dots increases net strain, because no threading dislocations are present it does not present the same risk of misfit dislocations being formed within the III-V active layer.

Figure 2:
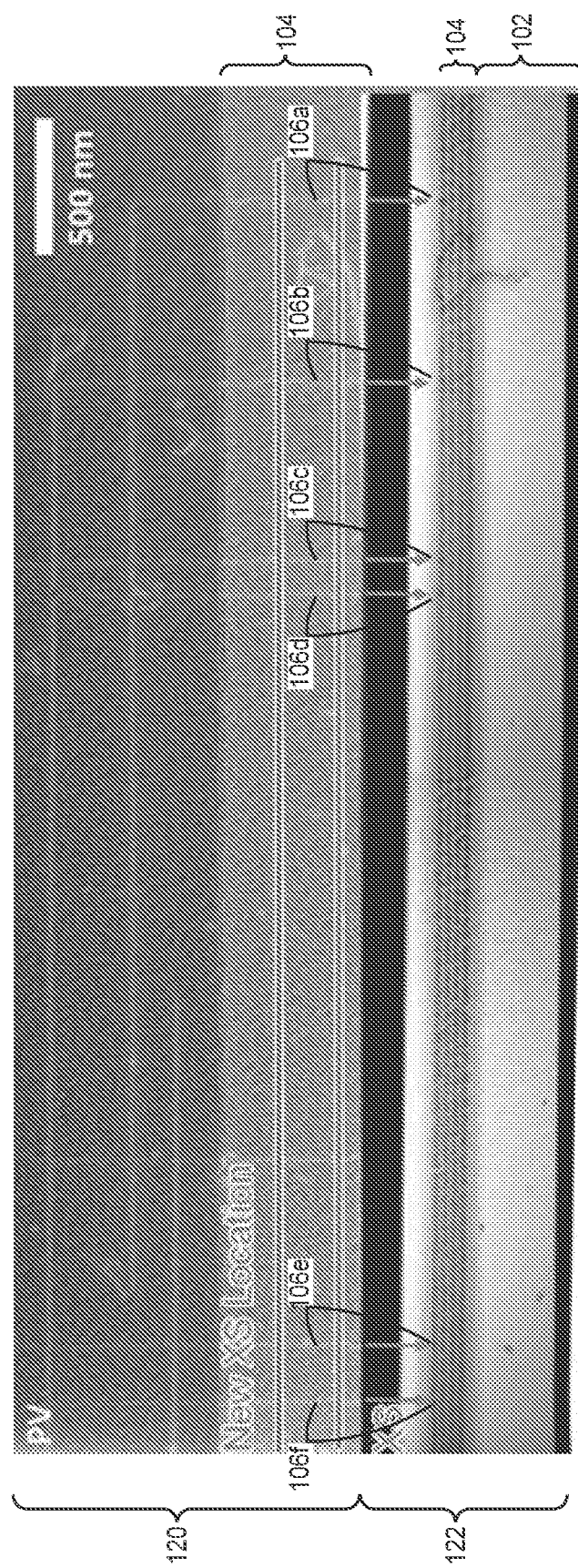
FIG. 2 is an hybrid image including a top portion that is a planar view of a III-V active layer and the lower portion is a cross-sectional view of the photonic integrated circuit as known in the prior art.

FIG. 2 is a hybrid image including a top portion 120 that is a planar view of active layer and the lower portion 122 is a cross-sectional view of the photonic integrated circuit as known in the prior art. The planar view shown in the top portion of FIG. 2 illustrates the formation of a plurality of misfit dislocations 106a-106f formed within the active layer 120 as a result of accumulating compressive strain energy. The lower portion 122 is a cross-sectional view that illustrates that each of the misfit dislocations 106a-106f shown in the top portion occurs at the topmost layer within the active region 104. For example, in the embodiment shown in FIG. 2 the misfit dislocation occurs within the fourth layer of quantum dots.

Figure 3A:
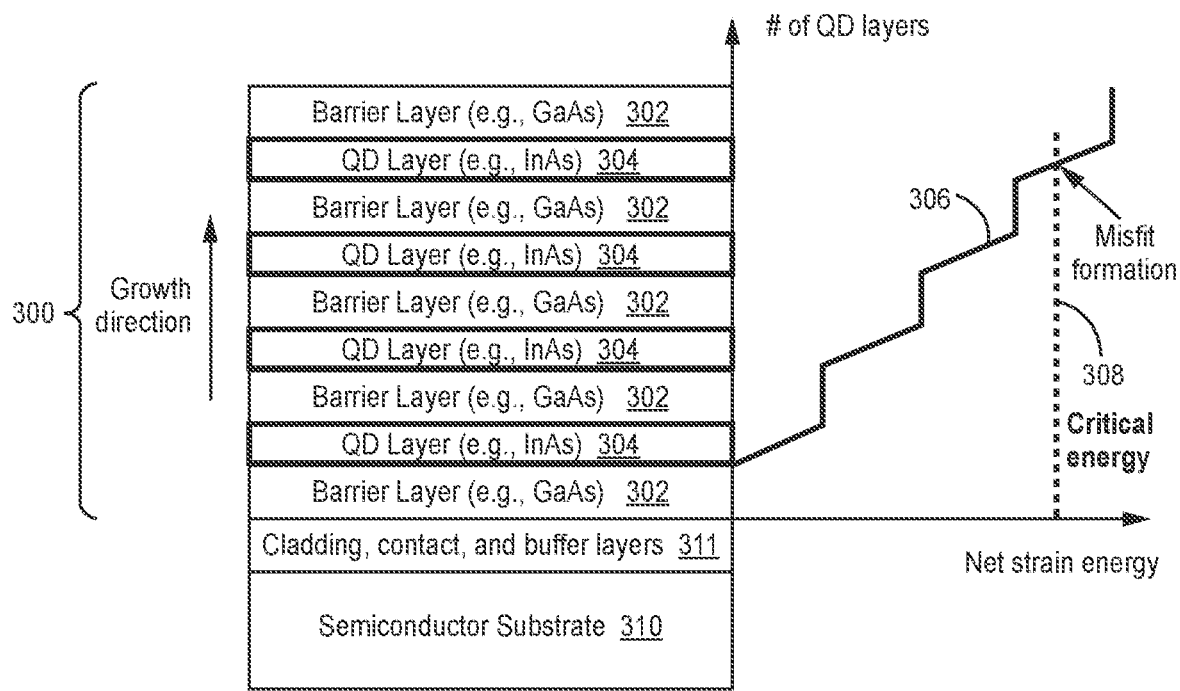
FIGS. 3a and 3b are cross-sectional views of active layers according to some embodiments of the present disclosure.
Figure 3B:
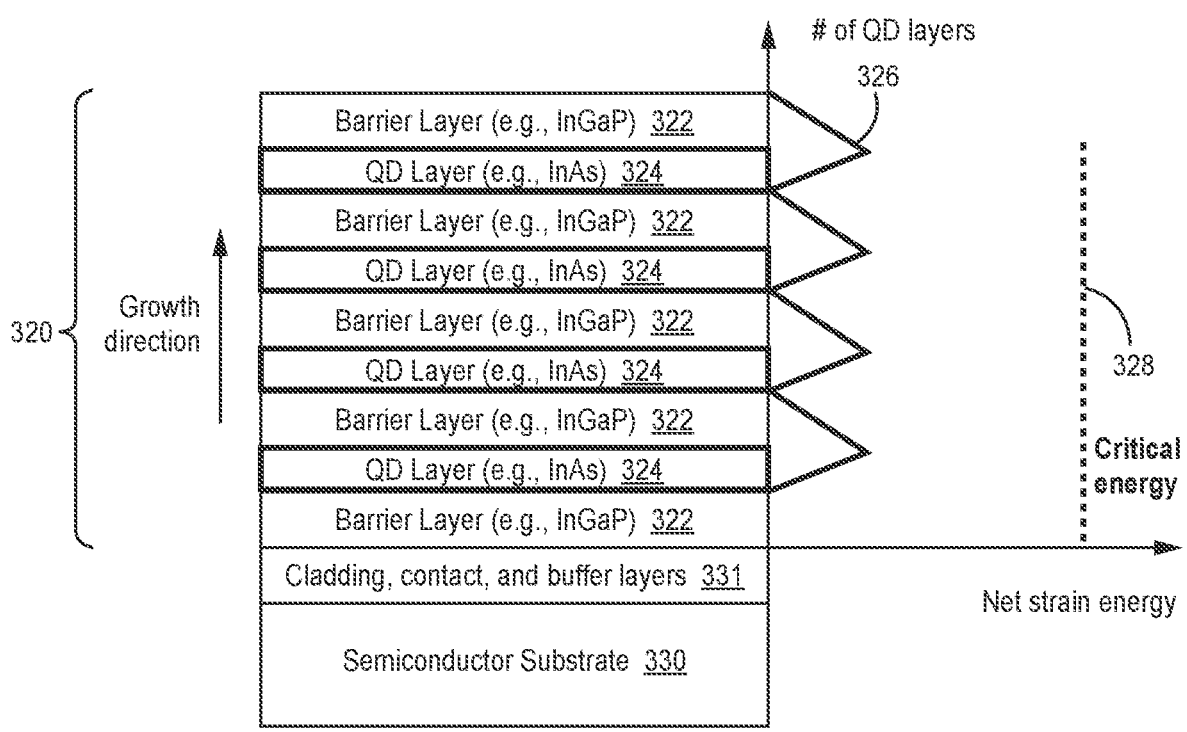

FIGS. 3a and 3b are cross-sectional views of an active region 300 according to some embodiments of the present disclosure. The embodiment shown in FIG. 3a, the active region 300 is comprised of a plurality of barrier layers 302 separated by a plurality of quantum dot (QD) layers 304, which are epitaxially deposited in the direction indicated (vertical) on a semiconductor substrate (e.g., silicon). In some embodiments, the active region 300 is epitaxially deposited on a semiconductor substrate 310—for example a silicon substrate. In some embodiments, one or more additional layers 311 (e.g., cladding layers, contact layers, and/or buffer layers) are located between the semiconductor substrate 310 and the active layer 300. In some embodiments, the one or more additional layers 311 are comprised, at least in part, of III-V type semiconductor material and therefore misfit dislocations may form between the semiconductor substrate 310 (e.g., silicon). In some embodiments, III-V semiconductor material (e.g., one or more additional layers 311 and/or active region 300) is epitaxially deposited on silicon (Si) substrate 310, resulting in one or more misfit dislocations at the interface between the Si substrate and the III-V layers, and as a a result one or more threading dislocations extending to the surface from the one or more misfit dislocations (as described with respect to FIG. 1). The threading dislocations (not shown in this view) propagate into the active region 300, which in this embodiments includes a plurality of quantum dot (QD) layers 304 separated by lattice-matched barrier layers 302. As described above, the threading dislocations serve as a heterogenous source for misfit dislocations within the active region 300 in response to a critical net strain energy being surpassed. Cumulative or net compressive strain associated with the plurality of QD layers is shown on the right side of FIG. 3a (line 306). In some embodiments, the composition of the QD layers causes a net tensile strain rather than compressive strain, but the effect is the same when the critical energy is reached. In this embodiment, compressive strain refers to a strain associated with the change in lattice constant (e.g., decrease in length). The compressive strain acts in a direction parallel with the planar surface of the QD layer (e.g., out of the page, into the page). In particular, the embodiment shown in FIG. 3a utilizes a Gallium-Arsenide (GaAs) barrier layers 302 and a plurality of Indium-Arsenide (InAs) QD layers 304. Each successive QD layer 304 causes an increase in the net strain energy until a maximum allowable strain (indicated by line 308) is reached causing a misfit dislocation. For example, in the embodiment shown in FIG. 3a the misfit dislocations would form in the fourth (top) InAs QD layer 304. In effect, the misfit dislocation relieves the net strain energy, but the resulting dislocation within the active region significantly degrades the lifetime of the laser. Although the embodiment shown in FIG. 3a utilizes InAs for the QD composition and GaAs for the barrier layer composition, in other embodiments both the QD layer and the barrier layer may be comprised of other combinations of semiconductor materials.

In some embodiments, knowledge of the maximum allowable strain and net strain resulting from each QD layer 304 is utilized to determine the maximum number of layers 304 to be included in the QD active region 300. For example, in the embodiment shown in FIG. 3a, a maximum of three QD layers 304 may be included within the active region without resulting in a misfit dislocation within the active region 300.

The reduced number of QD layers 304 (e.g., three layers) reduces the overall gain of the QD laser so that the net strain energy remains below the critical strain energy. In some embodiments, the reduction in gain is offset by increasing the cavity length of the laser in order to increase the overall power output by the laser. In addition, the reduction in misfit locations within the active region of the QD laser dramatically increases the reliability/longevity of the QD laser. Experimental results indicate that reduction in the number of QD layers from five to three only has a nominal effect on the gain associated with the QD laser.

Figure 4:
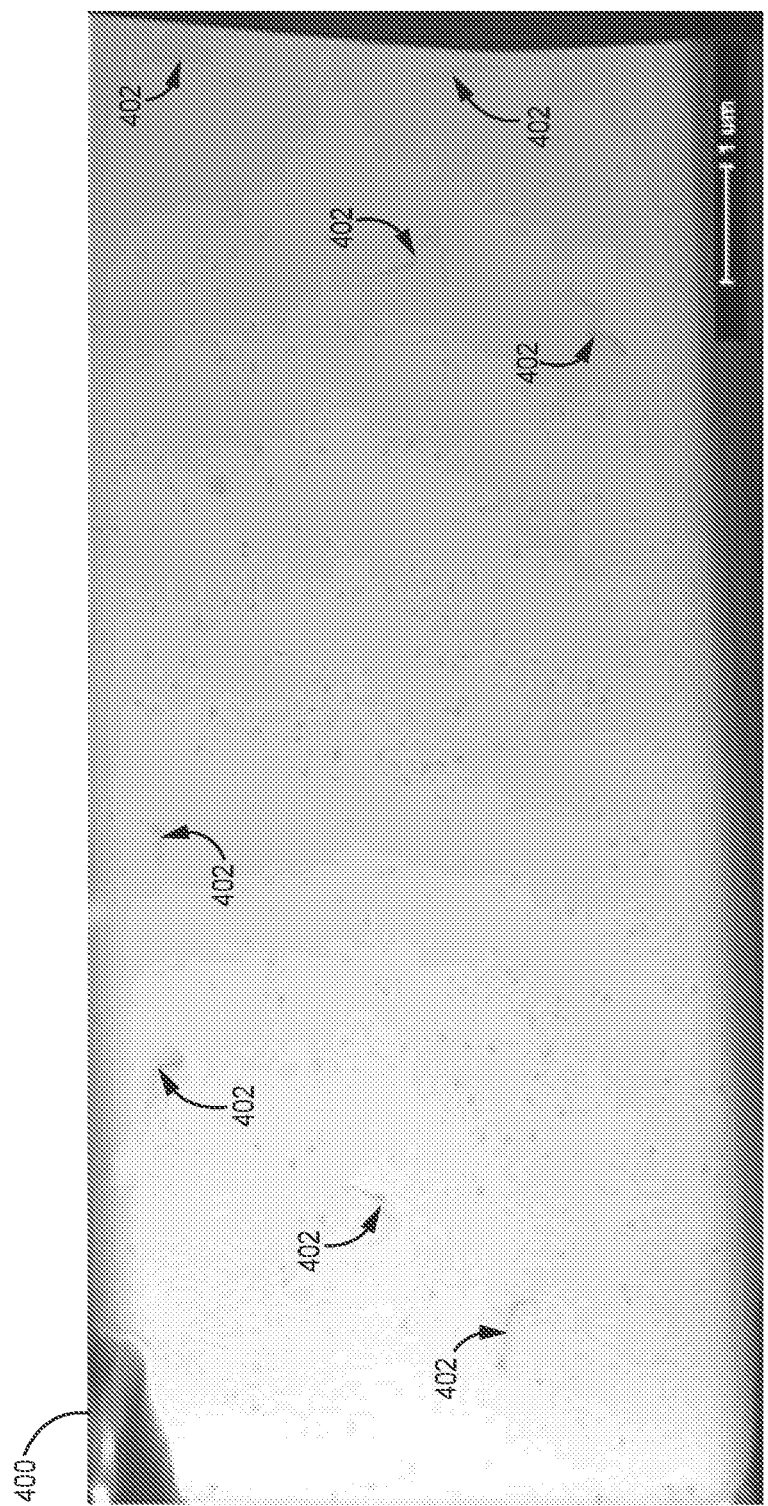
FIG. 4 is a planar view of an active layer grown according to an embodiment of the present disclosure.

For example, FIG. 4 is a planar view of an active layer grown according to the embodiment described with respect to FIG. 3a. The planar view is taken within the active region 400 of the QD laser and illustrates formation of a plurality of threading dislocations 402. Despite the presence of a plurality of threading dislocations 402, no misfit dislocations are evident within the active region 400, as a result of the selected number of QD layers (e.g., three in the example shown).

In the embodiment shown in 3b, the QD laser includes a semiconductor substrate 330 (e.g. silicon), one or more additional layers 331 (e.g., cladding, contact, and/or buffer layers), and an active region 320 comprised of a plurality of barrier layers 322 separated by a plurality of QD layers 324. In some embodiments, the active region 320 and one or more additional layers 331 are comprised of III-V type semiconductor material, and the semiconductor substrate 330 is comprised of silicon. This difference in material between the substrate layer and the one or more additional layers 331 and active region 320 results in the formation of one or more misfit dislocations at the boundary between the semiconductor substrate layer 330 and the layers. As discussed above, the one or more threading dislocations propagate into the active region and due to increasing net strain energy eventually result in the creation of one or more additional misfit dislocations within the active region 320. In this embodiment, each of the plurality of barrier layers 322 provides a tensile force that opposes the compressive force provided by each of the plurality of QD layers 324. For example, in one embodiment each of the plurality of barrier layers 322 is comprised of Indium-Gallium-Phosphide (InGaP) or Gallium-Arsenide-Phosphide (GaAsP), which are tensile strained materials relative to GaAs. In some embodiments, the composition of the barrier layer is selected to provide the desired tensile force attributes. For example, in one embodiment utilizing GaAsP, the composition is approximately 90% As. In other embodiments, the composition may be varied according to the application. As shown in the chart to the right of FIG. 3b, the compressive strain generated by each of the plurality of QD layers 324 is offset by a tensile strain generated by each of the plurality of barrier layers 322, such that the net strain (line 326) is reduced overall. In some embodiments, the compressive strain associated with each QD layer 324 is identically offset by the tensile strain associated with each barrier layer 322. However, even if the compressive strain and tensile strains associated with each layer are not offset entirely, the offsetting strains may allow additional QD layers 324 to be epitaxially deposited without exceeding the maximum allowable strain (indicated, by line 328) such that a misfit dislocation is formed in the active layer. In some embodiments the compressive strain associated with each QD layer 324 is slightly greater than the tensile strain associated with each barrier layer 322. In other embodiments, the compressive strain associated with each QD layer 324 is slightly less than the tensile strain associated with each barrier layer 322.

In some of the embodiments, the composition of QD layer 324 is selected to provide a tensile force (rather than a compressive force). In this embodiment, the composition of the barrier layer 322 is selected to provide a compressive force that offsets the tensile force of the QD layer. As described above, in some embodiments the tensile force associated with each QD layer 324 is greater than the compressive force associated with each barrier layer 322, resulting in a net increase in tensile force as the number of layers is increased. In some embodiments, the number of layers of QD layer 324 and barrier layers 322 are selected to ensure the total tensile force remains below a threshold level to prevent the formation of misfit dislocations within the active layer. In other embodiments, the tensile force associated with each QD layer 324 is less than the compressive force associated with each barrier layer 322, resulting in a net increase in compressive force as the number of layers is increased. In some embodiments, the number of layers of QD layer 324 and barrier layers 322 are selected to ensure the total compressive force remains below a threshold level to prevent the formation of misfit dislocations within the active layer.

Figure 3C:
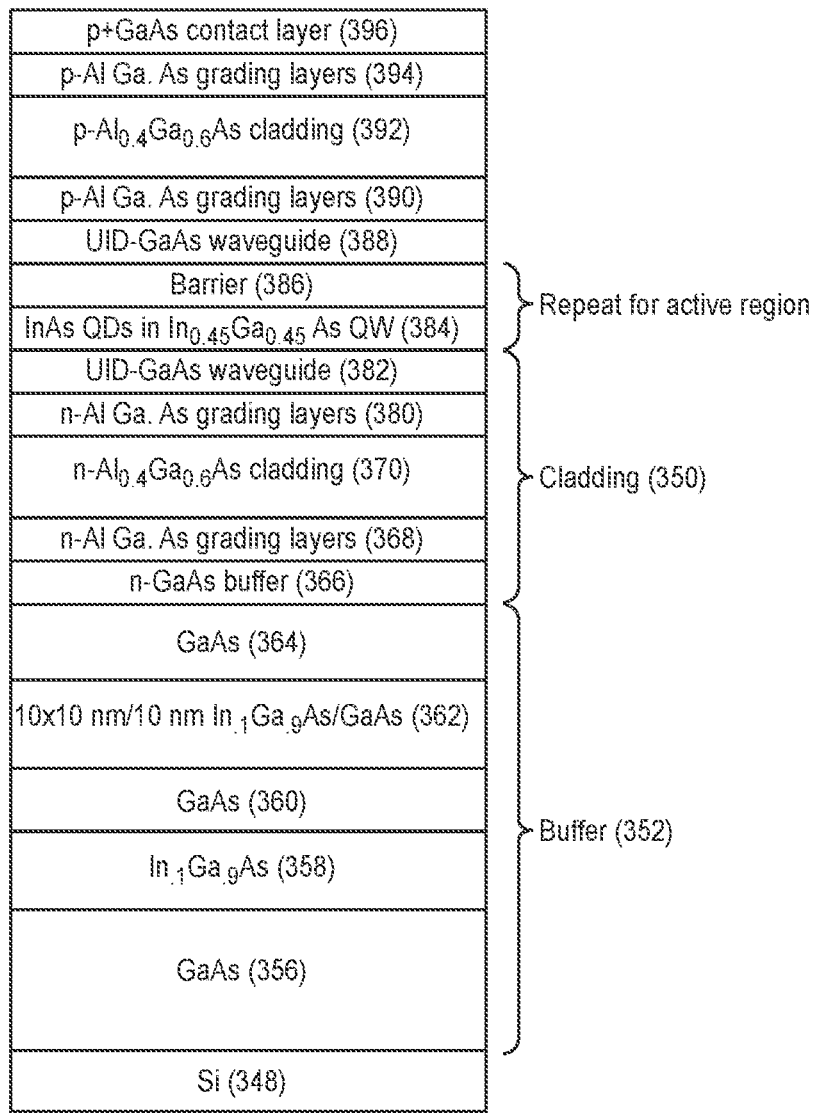
FIG. 3c is a cross-sectional view of the semiconductor substrate, cladding, contact and buffer layers in more detail according to some embodiments.

Referring now to FIG. 3c, a cross-sectional view is provided of the various layers utilized according to some embodiments. The embodiment shown in FIG. 3c utilizes a silicon (Si) substrate 348, wherein a buffer layer 352, cladding layer 350 and additional layers are fabricated on top of the silicon substrate 348. In some embodiments, the buffer layer 352 comprises a GaAs layer 356, an $In_{.1}Ga_{.9}As$ layer 358, a GaAs layer 360 and a $In_1Ga_9As/GaAs$ layer 362, and GaAs layer 364. The cladding layer 350 includes a n-doped Ga-As buffer 366, n-doped AlGaAs grading layer 368, n-doped $Al_{0.4}Ga_{0.6}As$ cladding layer 370, n-doped AlGaAs grading layer 380, and a UID-Ga-As waveguide layer 382. In the embodiment shown in FIG. 3c, an InAs quantum dot (QD) layer in an InGaAS quantum well (QW) and barrier layer 386 are included on top of the cladding layer 350. These layers will be utilized in the active region as well. The one or more layers further include an UID-GaAs waveguide 388, a p-doped AlGaAs grading layer 390, p-doped $Al_{0.4}Ga_{0.5}As$ cladding layer 392, a p-doped AlGaAs grading layer 394 and a p-doped GaAs contact layer 396. The active region (not shown in this view) would be epitaxially deposited on top of the layers as shown in FIGS. 3a and 3b.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A quantum dot (QD) laser comprising:
a silicon substrate; and
an active region epitaxially deposited on the silicon substrate, wherein the active region is comprised of III-V type semiconductor material that results in one or more misfit dislocations located at a boundary between the silicon substrate and the III-V type semiconductor material, wherein the active region includes a plurality of barrier layers and a plurality of QD layers interposed between each of the plurality of barrier layers, wherein a net compressive strain associated with the plurality of QD layers is maintained below a maximum allowable strain to prevent formation of misfit dislocations within the active region of the QD laser, wherein each barrier layer provides a net tensile strain that offsets the net compressive strain associated with the plurality of QD layers to maintain the net strain below the maximum allowable strain to prevent formation of misfit dislocations within the active region of the QD laser.

2. The QD laser of claim 1, wherein the active region contains a plurality of threading dislocations originating from the misfit dislocation located at the boundary between the silicon substrate and the III-V type semiconductor material, and wherein the threading dislocations do not terminate at misfit locations within the active layer.

3. The QD laser of claim 1, wherein the barrier layer comprises Indium-Gallium-Phosphide (InGaP).

4. The QD laser of claim 3, wherein the InGaP barrier layer is comprised of approximately 90% Gallium.

5. The QD laser of claim 1, wherein the barrier layer is comprised of Indium-Arsenide-Phosphide (InAsP).

6. The QD laser of claim 1, wherein the plurality of barrier layers and the plurality of QD layers do not include nitrogen.

7. A quantum dot (QD) laser comprising:
a semiconductor substrate; and
an active region epitaxially deposited on the semiconductor substrate, wherein the active region includes a plurality of barrier layers and a plurality of QD layers interposed between each of the plurality of barrier layers, wherein each barrier layer provides a strain that at least partially offsets a strain introduced by each QD layer, wherein the active region includes a plurality of threading dislocations extending from one or more misfit dislocations formed between the semiconductor substrate and the active region, wherein the strain provided by the barrier layer that at least partially offsets the strain introduced by each QD layer prevents formation of misfit locations within the active region.

8. The QD laser of claim 7, wherein the semiconductor substrate is comprised of silicon and the active region is comprised of one or more III-V semiconductors.

9. The QD laser of claim 7, wherein a net strain within the active region is maintained below a maximum allowable strain to prevent formation of misfit dislocations within the active region.

10. The QD laser of claim 7, further including:
a buffer layer comprised of III-V type semiconductor material epitaxially deposited on the semiconductor substrate, wherein a misfit dislocation is formed between the buffer layer and the semiconductor substrate; and a cladding layer comprised of III-V type semiconductor material epitaxially deposited on the buffer layer.

11. The QD laser of claim 7, wherein the plurality of barrier layers and the plurality of QD layers do not include nitrogen.

* * * * *